(12) United States Patent
Nobunaga

(10) Patent No.: US 7,231,537 B2
(45) Date of Patent: Jun. 12, 2007

(54) FAST DATA ACCESS MODE IN A MEMORY DEVICE

(75) Inventor: Dean Nobunaga, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 506 days.

(21) Appl. No.: 10/613,119

(22) Filed: Jul. 3, 2003

(65) Prior Publication Data

US 2005/0005183 A1 Jan. 6, 2005

(51) Int. Cl.
*G06F 1/04* (2006.01)

(52) U.S. Cl. .................. 713/401; 713/400; 713/500; 713/501; 713/502; 713/503; 713/600; 713/601

(58) Field of Classification Search ............... None
See application file for complete search history.

(56) References Cited

U.S. PATENT DOCUMENTS

| | | | |
|---|---|---|---|
| 3,984,812 A | 10/1976 | Dahlberg | |
| 4,079,459 A | 3/1978 | Grant | |
| 5,157,775 A | 10/1992 | Sanger | |
| 5,600,802 A | 2/1997 | Yazdy | |
| 5,963,069 A * | 10/1999 | Jefferson et al. | 327/158 |
| 6,208,183 B1 * | 3/2001 | Li et al. | 327/161 |
| 6,278,641 B1 * | 8/2001 | Chen et al. | 365/194 |
| 6,529,057 B2 * | 3/2003 | Yee | 327/172 |
| 6,661,272 B2 * | 12/2003 | Kim et al. | 327/291 |
| 6,690,219 B2 * | 2/2004 | Chuang | 327/176 |
| 6,839,860 B2 * | 1/2005 | Lin | 713/401 |
| 6,975,695 B1 * | 12/2005 | Kuhn | 375/371 |
| 2004/0239387 A1 * | 12/2004 | Zhang et al. | 327/158 |

\* cited by examiner

*Primary Examiner*—Abdelmoniem Elamin
(74) *Attorney, Agent, or Firm*—Leffert, Jay & Polglaze, P.A.

(57) ABSTRACT

A fast data access circuit that has both a standard clock mode and a fast data access mode. The mode is selectable through a mode/configuration register. A configuration word loaded into the register has bits to indicate the desired mode and the input clock frequency. In the fast data access mode, a clock delay circuit uses the clock frequency setting bits to select a delay to be added to the input clock. The higher the clock frequency, the less the added delay. The delayed clock generates FIFO control signals to control a data FIFO register. During the fast data access mode, the data is output from the data FIFO register at a faster rate than in the standard clock mode.

10 Claims, 8 Drawing Sheets

| CLK FREQ | | WB | OP MODE | | CAS LATENCY | | | BT | BURST LENGTH | | | DESCRIPTION |
|---|---|---|---|---|---|---|---|---|---|---|---|---|
| M11 | M10 | M9 | M8 | M7 | M6 | M5 | M4 | M3 | M2 | M1 | M0 | |
| | | | | | | | | | 0 | 0 | 0 | Burst1 |
| | | | | | | | | | 0 | 0 | 1 | Burst2 |
| | | | | | | | | | 0 | 1 | 0 | Burst4 |
| | | | | | | | | | 0 | 1 | 1 | Burst8 |
| | | | | | | | | | 1 | 0 | 0 | Reserved |
| | | | | | | | | | 1 | 0 | 1 | Reserved |
| | | | | | | | | | 1 | 1 | 0 | Reserved |
| | | | | | | | | 0 | 1 | 1 | 1 | Full Page |
| | | | | | | | | 1 | | | | Sequential |
| | | | | | | | | | | | | Interleaved |
| | | | | | 0 | 0 | 0 | | | | | Reserved |
| | | | | | 0 | 0 | 1 | | | | | Latency1 |
| | | | | | 0 | 1 | 0 | | | | | Latency2 |
| | | | | | 0 | 1 | 1 | | | | | Latency3 |
| | | | | | 1 | 0 | 0 | | | | | Reserved |
| | | | | | 1 | 0 | 1 | | | | | Reserved |
| | | | | | 1 | 1 | 0 | | | | | Reserved |
| | | | | | 1 | 1 | 1 | | | | | Reserved |
| | | | 0 | 0 | | | | | | | | Standard Operation |
| | | | 0 | 1 | | | | | | | | Fast TAC Mode |
| | | | 1 | 0 | | | | | | | | Reserved |
| | | | 1 | 1 | | | | | | | | Reserved |
| | | 0 | | | | | | | | | | Programmed Burst Length |
| | | 1 | | | | | | | | | | Single Location Access |
| 0 | 0 | | | | | | | | | | | 143MHz |
| 0 | 1 | | | | | | | | | | | 166MHz |
| 1 | 0 | | | | | | | | | | | 200MHz |
| 1 | 1 | | | | | | | | | | | 250MHz |

Fig. 2

FAST DATA ACCESS MODE IN A MEMORY DEVICE

TECHNICAL FIELD OF THE INVENTION

The present invention relates generally to memory devices and in particular the present invention relates to fast data access in memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), and synchronous dynamic random access memory (SDRAM).

As microprocessor speeds continue to increase, memories have to keep pace. Synchronous memories have done so with high clock speeds as well as pipelined data architectures. Pipelined architectures are typically used to divide the data path into multiple, shorter segments in order to achieve higher clock speeds. However, the higher the clock frequency, the faster the required data access time.

Pipelined architecture also increases the read latency. For example, a three stage data pipeline can accommodate read latencies of up to three clock cycles. The final stage determining the data access time for the read latency of three clock cycles.

For the reasons stated above, and for other reasons stated below which will become apparent to those skilled in the art upon reading and understanding the present specification, there is a need in the art for a way to decrease data access time in a memory device having a pipeline architecture.

SUMMARY

The above-mentioned problems with data access times in a memory device and other problems are addressed by the present invention and will be understood by reading and studying the following specification.

The present invention encompasses a fast data access circuit that increases the rate at which data is output from the memory device as an input clock frequency increases. The circuit comprises a clock delay circuit that applies a user selectable time delay to the input clock signal. In one embodiment, the delay decreases as the clock frequency increases. The clock delay circuit generates a delayed clock signal;

A control circuit generates a mode control signal. In one embodiment, this circuit is a mode/configuration register that is loaded with a configuration word to set the modes/configurations of the memory device.

A multiplexing circuit has one input coupled to the input clock signal and a second input coupled to the delayed clock signal. The multiplexing circuit selects between the two inputs based on the mode control signal.

A data output register is coupled to a memory array of the memory device. The rate at which the data bits are output is controlled by the selected clock output by the multiplexer circuit.

Further embodiments of the invention include methods and apparatus of varying scope.

BRIEF DESCRIPTION OF THE DRAWINGS

FIG. 2 shows a table of one embodiment of the mode register of the present invention.

DETAILED DESCRIPTION

Figure 1:
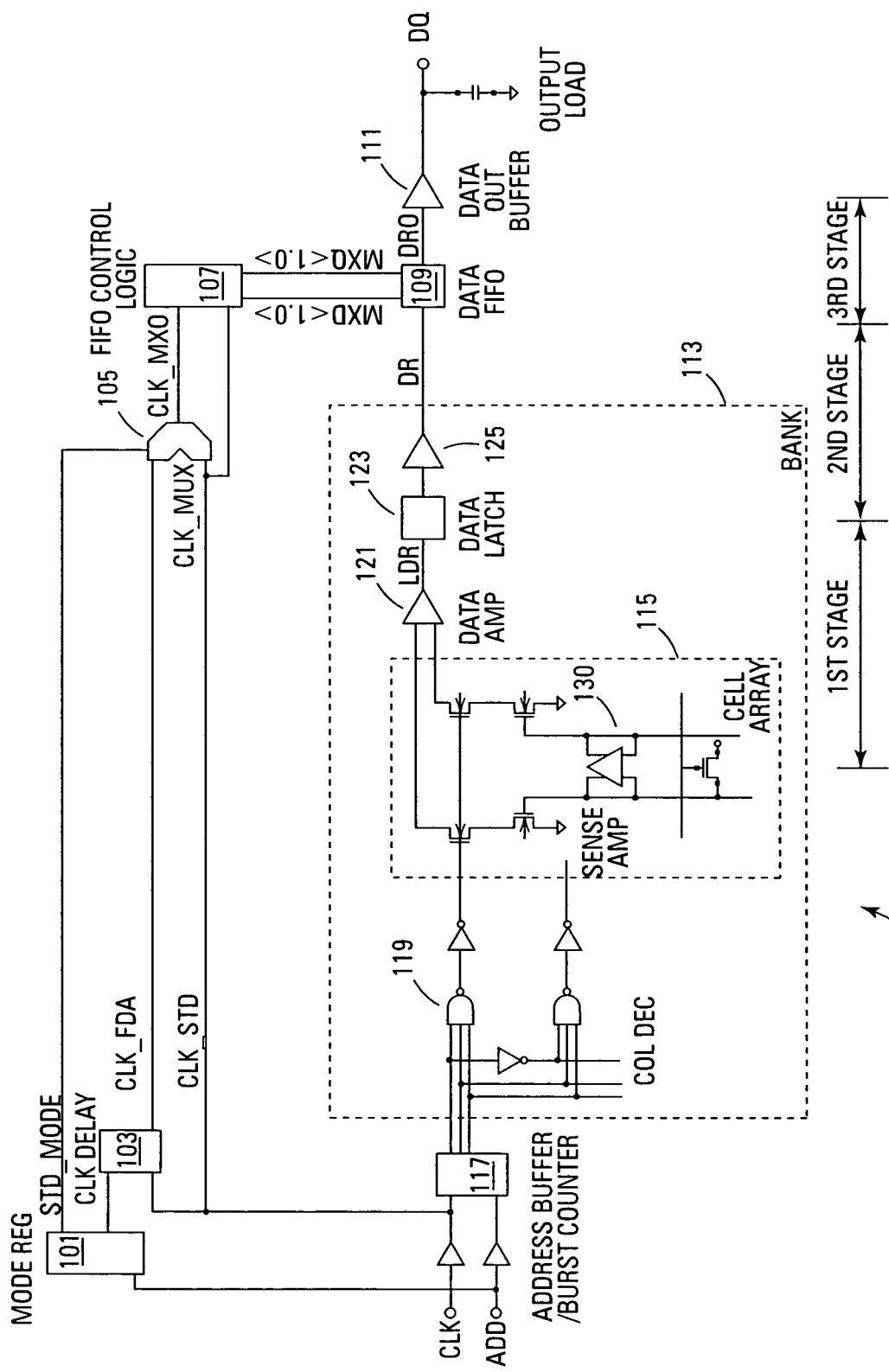
FIG. 1 shows a block diagram of one embodiment of a fast data access circuit of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a block diagram of one embodiment for a fast data access circuit of the present invention. This circuit is implemented in a three-stage data pipelined architecture. In one embodiment, the first stage is from a sense amplifier 130 to a data latch 123. The second stage is from the data latch 123 to a data FIFO 109. The third stage is from the data FIFO 109 to the DQ pad of the memory device. The present invention, however, is not limited to any quantity of pipelined stages nor to any certain composition of each stage.

An address and clock signal are input to an address buffer/burst counter 117. The address buffer/burst counter 117 provides the addresses to the memory bank 113 for further decoding by the column decoding circuitry 119. As is well known in the art, the burst counter 117 sequentially counts through a predetermined number of addresses and provides these addresses to the memory bank 113 so that the predetermined number of data bits can be output.

For purposes of clarity, only one cell array 115 and two column decode circuits 119 are shown. However, a memory bank may be comprised of millions of cell arrays 115, each column of cell arrays having a separate column decode circuit 119. The memory bank further includes a data amplifier 121 that combines the differential data from the cell array and outputs the data to a latch 123. The latched data is output from the memory bank 113 through a data output buffer 125. The operation of the circuitry of the memory bank 113 is well known in the art and is not discussed further.

The input address signals are also input to a mode/configuration register 101. As discussed subsequently with reference to FIG. 2, the mode/configuration register 101 accepts a configuration word, from the address lines, to set up the various modes of the memory device. Two such modes are the standard mode and the fast data access mode.

The configuration word to the mode/configuration register 101 also selects the clock speed of the input clock signal (CLK) to the circuit. In one embodiment, there are four selectable clock speeds: 143 MHZ, 166 MHz, 200 MHz, and 250 MHz. However, the quantity of clock speeds is determined by the quantity of bits available in the configuration word for this function. If only one bit is available, only two clock speeds are selectable. If more than two bits are available, more than four clock speeds are selectable.

In an alternate embodiment, the mode is selected by a state machine or other control circuit of the memory device. Such a control circuit may select the desired clock speed using control signal outputs.

The clock signal is input to a clock delay circuit 103. This circuit 103 provides the clock with a set delay that depends on the selected clock speed in the mode/configuration register 101. The clock delay circuit 103 is discussed subsequently in greater detail with reference to FIG. 3.

In one embodiment, there are four selectable input clock speeds for the fast data access mode that are selected by an output signal from the mode/configuration register 101 to the clock delay circuit 103. The present invention is not limited to any predetermined quantity of delays. Alternate embodiments may have more or less than four selectable delays, including a continuously variable delay.

The delayed clock, CLK_FDA, is output from the clock delay circuit 103 and input to a clock multiplexer circuit 105. The standard clock, CLK_STD, is also input to the clock multiplexer circuit 105. A standard mode select output (STD_MODE) from the mode/configuration register 101 is used as a selection signal for the multiplexer 105. In one embodiment, when STD_MODE is a logical high signal, the standard clock is selected. When STD_MODE is a logical low signal, the fast data access clock (CLK_FDA) is selected to be output from the multiplexer 105. Alternate embodiments use inverse logic states for the STD_MODE signal to select between the standard clock and the fast data access mode clock.

The clock selected by the multiplexer 105 is output to first-in-first-out (FIFO) control logic 107. The FIFO control logic 107 is responsible for generating the data output control pulses to the data FIFO circuit 109. These signals are illustrated as MXD<1:0> and MXQ<1:0> and are used to enable different portions of the data FIFO circuit 109 to permit the input data (DR) from the memory bank 113 to travel through the third stage at different speeds, depending on the selected mode. The input data (DR) may be part of a data stream if a burst mode has been selected in the mode/configuration register 101.

Alternate embodiments use other circuits to output the data instead of the data FIFO circuit 109. For example, some type of data output register that can temporarily store data for subsequent output controlled by either the standard clock or the fast data access clock is encompassed by the present invention.

A data output buffer 111 outputs the DRQ data from the data FIFO circuit 109 as DQ. In one embodiment, DQ is coupled to the output pin of the memory device. The third stage circuitry is illustrated in greater detail and discussed subsequently with reference to FIG. 4.

FIG. 2 illustrates a table of one embodiment of a memory mode/configuration register of the present invention. The bits (M11–M0) of the configuration word program the various modes of the memory device. These bits set the clock frequency (CLK FREQ), burst mode (WB), operation mode (OP MODE), column access strobe latency (CAS LATENCY), burst type (BT), and burst length. Alternate embodiments set other memory device configurations and/or use different bits and quantity of bits to perform these functions.

The memory mode (i.e., standard or fast data access) is selected by bits M8 and M7 of the configuration word, as illustrated in the mode selection area 201 of the table of FIG. 2. One of the four available clock frequencies 200 is selected by the M11 and M10 bits of the configuration word. If the standard mode has been selected, the M11 and M10 bits are not relevant since the clock speed is less than 143 MHz in this embodiment.

The table of FIG. 2 is for illustration purposes only and does not limit the invention to any one memory mode or configuration table. Alternate embodiments may use configuration words having different lengths than is illustrated or different bit states to program a particular memory configuration.

Figure 3:
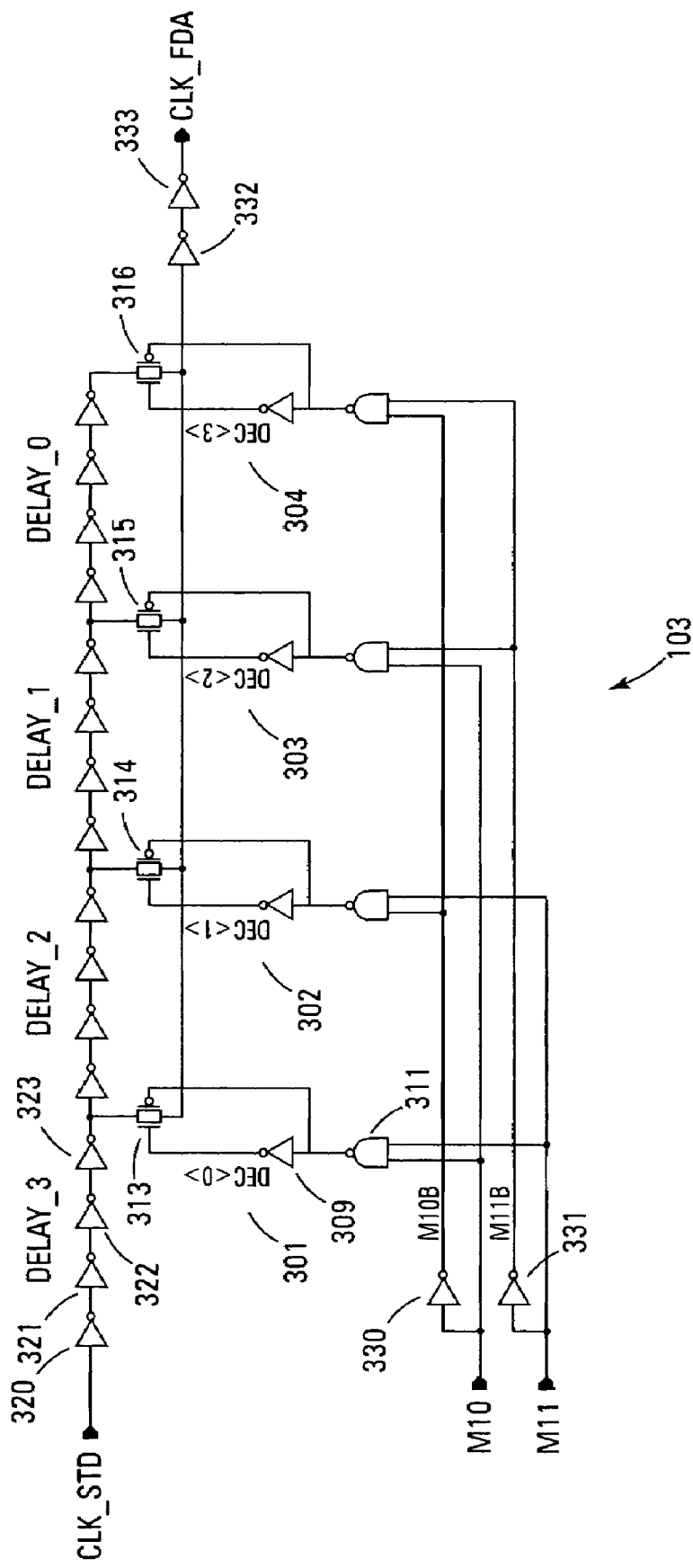
FIG. 3 shows a block diagram of one embodiment of the clock delay circuit of the present invention.

FIG. 3 illustrates a logic diagram of one embodiment of the clock delay circuit 103 of FIG. 1. This embodiment includes four selectable delays that are selected by the M11 and M10 bits of the configuration word of the mode/configuration register. Alternate embodiments may use different quantities of delays, different delay lengths, and different types of delay elements.

The clock delay circuit 103 is comprised of four delay circuits (DELAY_0–3) that are each made up of four inverters 320–323 that cause the delay in the input clock (CLK_STD). Each delay is selected by selection logic 301–304 that, in one embodiment, comprise a NAND gate 311 and an inverter 309. This logic 309 and 311 activates a transmission gate 313 when the input signals (M11 and M10) are true.

When the shortest delay is activated, DELAY_3 is the only delay used. In this case, the CLK_STD signal is input through the first activated transmission gate 313 after experiencing four gate delays. The delayed signal is output as the CLK_FDA.

When a somewhat longer delay is necessary, both DELAY_3 and DELAY_2 are selected. In this case, the first transmission gate 313 is disabled and the second transmission gate 314 is enabled. The input clock signal, CLK_STD, is then input through eight gate delays before being output through the second transmission gate 314 as CLK_FDA.

Selecting the third longest delay causes DELAY_1–DELAY_3 to be selected. In this case, the first two transmission gates 313 and 314 are disabled and the third transmission gate 315 is enabled. The input clock is then input through twelve gate delays before being output through the third transmission gate 315 as CLK_FDA.

Finally, selecting the fourth delay causes DELAY_0–DELAY_3 to be selected. In this case, only the last transmission gate 316 is enabled so that the input clock signal goes through sixteen inverter gate delays before being output through the last transmission gate 316 as CLK_FDA.

The clock delay circuit 103 also includes additional inverters 330–333 that are used to provide the proper states of the input signals for decoding 330 and 331 as well as adding additional delay 323 and 333 at the output of the circuit 103. The logic illustrated in FIG. 3 is for purposes of illustration only. The present invention is not limited to any one circuit architecture to generate the separate delays used in the fast access mode.

As discussed above in FIG. 2, M11 and M10 set the input clock frequency for the memory device. Since these signals also set the delay for each frequency, it can be seen from the clock delay circuit 103 that the higher the clock frequency indicated by M11 and M10, the shorter the delay required to generate CLK_FDA.

Figure 4:
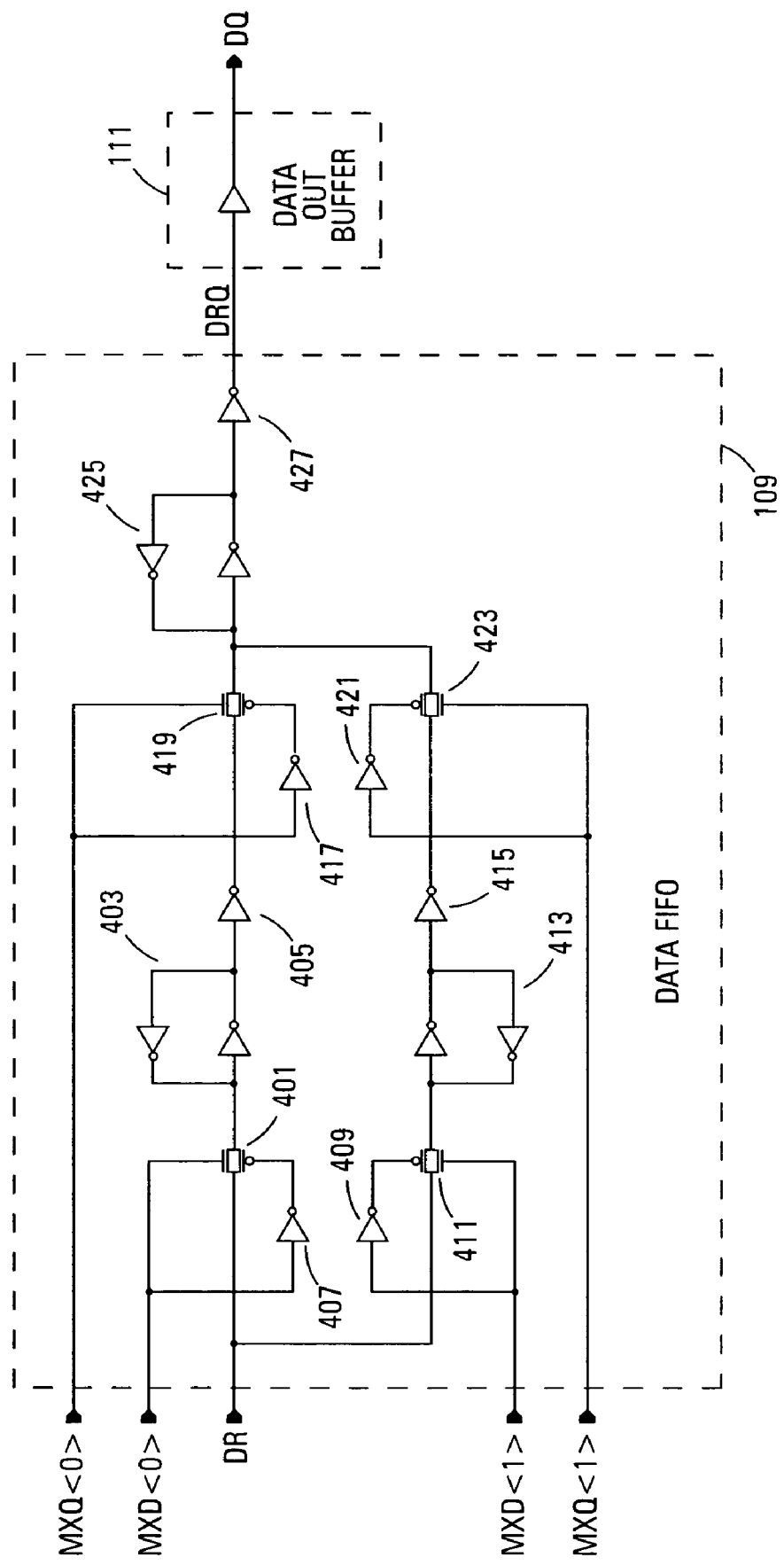
FIG. 4 shows a more detailed logic diagram of one embodiment of the data buffer and output buffer in accordance with FIG. 1.

FIG. 4 illustrates a logic diagram of the data FIFO 109 and data out buffer 111 as discussed in FIG. 1. The data FIFO uses the MXD<1:0> and MXQ<1:0> pulses from the FIFO control logic as control inputs; MXD<1:0> controls the latching of the data and MXQ<1:0> controls the output of the data. DR is the data bit that is output from the memory cell to be latched into the FIFO 109.

The access of DR to one latch 403 is controlled by the transmission gate coupled to MXD<0>. In one embodiment, when this signal is a logic high, the DR bit is latched into the top latch 403. An inverter 407 inverts the MXD<0> signal for application to the inverted control connection of the transmission gate 401.

The DR bit is latched into the bottom latch 413, through the bottom transmission gate 411, when MXD<1> is a logic high. An inverter 409 inverts MXD<1> for application to the inverted control connection of the transmission gate 411.

The outputs of each of the latches 403 and 413 are output through an inverter 405 and 415 to a respective transmission gate 419 and 423. The output of the data bit that was latched in the top latch 403 is controlled through one transmission gate 419. The control signal MXQ<0> is input to one control input of the transmission gate 419 and through an inverter 417 for application to the inverted control input of the transmission gate 419.

The second transmission gate 423 controls the output of the bit latched into the bottom latch 413. The control signal MXQ<1> is input to one control input while an inverter 421 inverts the control signal into the inverted control input of the transmission gate 423.

The bit output through the output transmission gates 419 or 423 is latched into an output latch 425 before going through an inverter 427 and output as DRQ. DRQ is then input to the data out buffer 111 to be output as the DQ signal.

Figure 6:
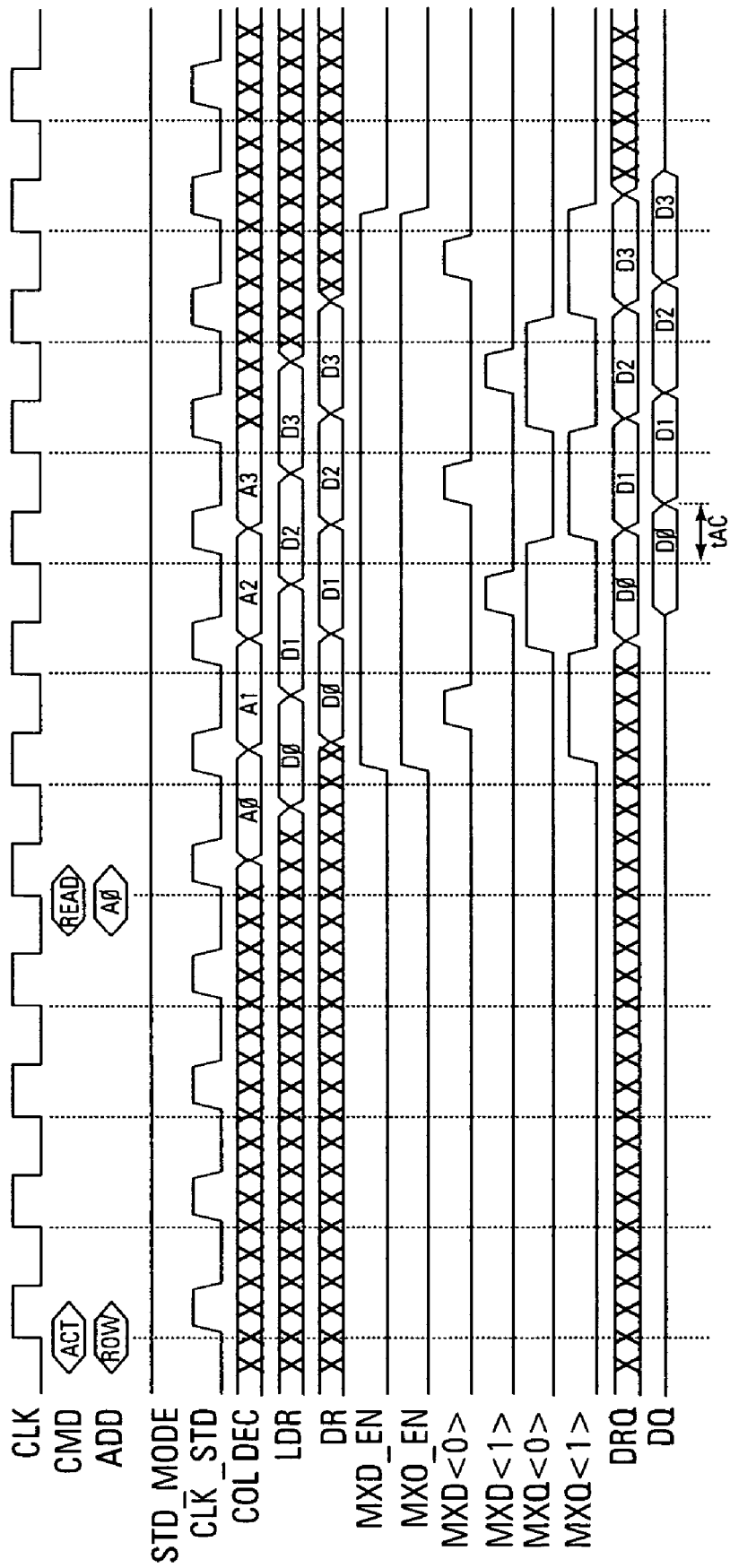
FIG. 6 shows a timing diagram of one embodiment of a standard operating mode for read timing of a memory device of the present invention.

The operation of the data FIFO 109 is best illustrated with reference to the timing diagrams of FIGS. 6 and 7. The timing diagram illustrated in FIG. 6 shows the standard operating mode for read timing with a column address strobe latency of three. The timing diagram illustrated in FIG. 7 shows the fast data access mode of the present invention for read timing with a column address strobe latency of three.

While one latch of the FIFO is being loaded from the DR input, the other latch is driving its data out onto the DRQ bus. This is accomplished with the MXD and MXQ signals.

Figure 7:
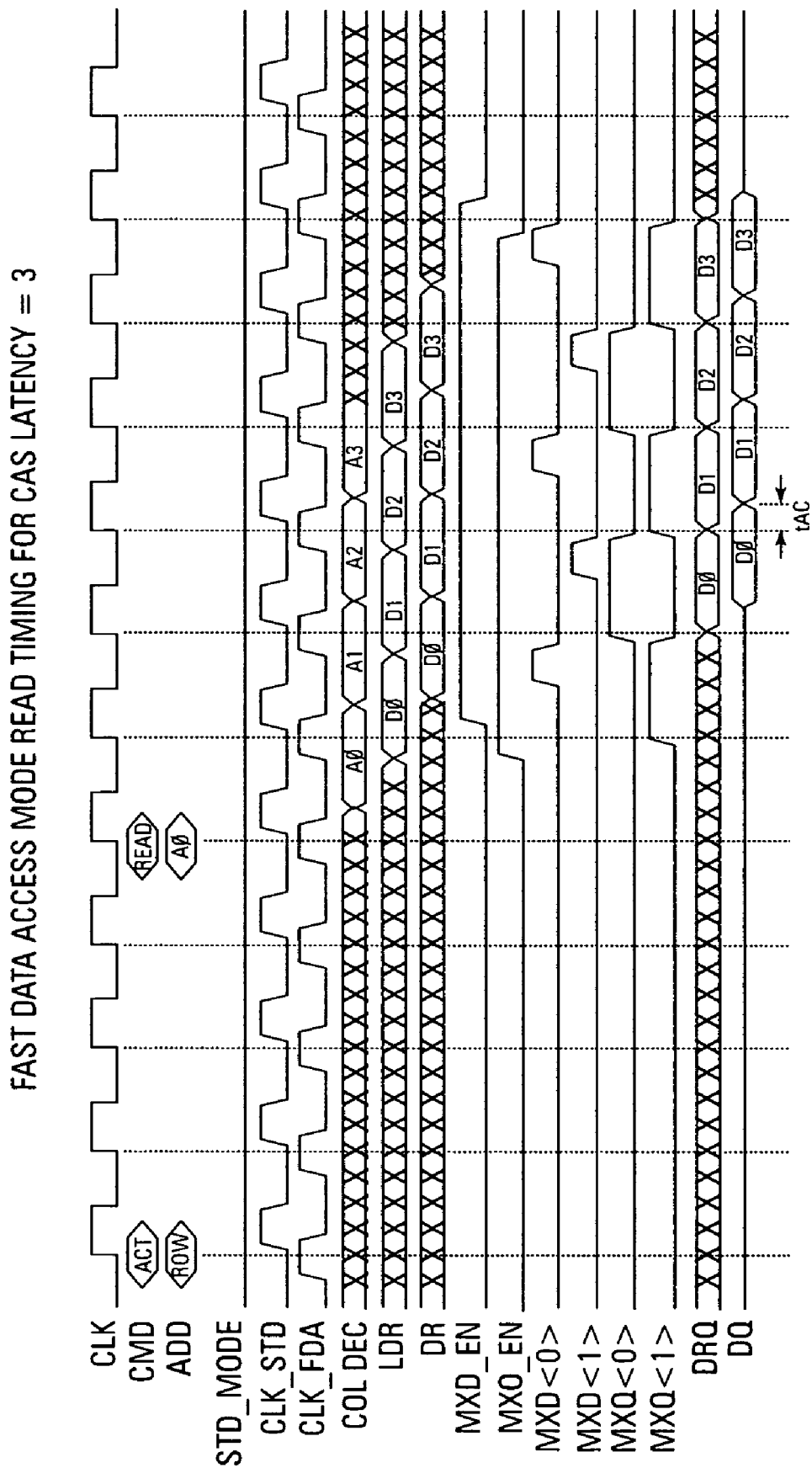
FIG. 7 shows a timing diagram of one embodiment of a fast data access mode for read timing of a memory device of the present invention.

By comparing the MXQ<1:0> signal of FIG. 7 with the same signal of FIG. 6, it can be seen that the fast data access mode MXQ<1:0> occurs sooner than its FIG. 6 counterpart. Since the MXQ<1:0> signals control the output of the data through the data FIFO, the data is output from the FIFO at a faster rate than under the standard operating mode. FIG. 7 also shows that this results in $t_{AC}$ being shorter than its counterpart time in FIG. 6, thus indicating the faster data access. The rate at which data is loaded into the FIFO is unchanged.

Figure 5:
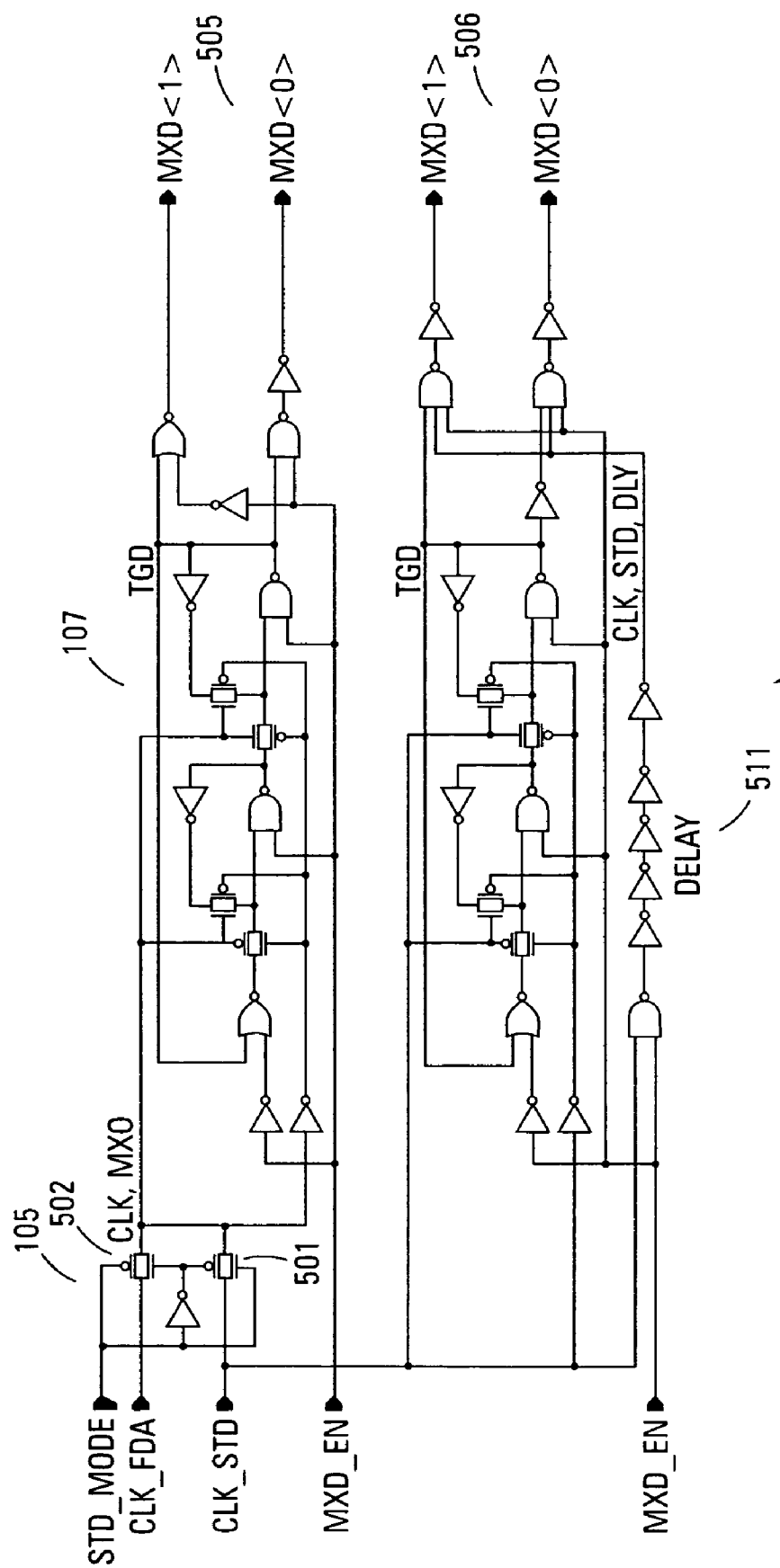
FIG. 5 shows a more detailed logic diagram of one embodiment of the clock multiplexer and FIFO control logic in accordance with FIG. 1.

FIG. 5 illustrates a more detailed logic diagram of one embodiment of the clock multiplexer 105 and FIFO control logic 107 of FIG. 1. This diagram is for purposes of illustration only. In alternate embodiments, the multiplexer 105 and control logic 107 may be implemented in other ways.

The logic diagram comprises a set of transmission gates and an inverter that make up the multiplexer 105. When the mode control signal (STD_MODE) is high, CLK_STD is allowed through the lower transmission gate 501 while the upper transmission gate 502 is turned off. When the mode control signal is low, CLK_FDA is allowed through the upper transmission gate 502 while the lower transmission gate 501 is turned off.

The FIFO control logic section 107 is comprised of a toggle flip flop 505 that generates the MXQ<1:0> signals and a toggle flip flop 506 with a delay element 511 that generates the MXD<1:0> signals. The control logic section 107 includes two enable input signals, MXQ_EN and MXD_EN, that originate from another logic block (not shown). These signals and their relationship with the outputs of the FIFO control logic 107 are illustrated in the timing diagrams of FIGS. 6 and 7.

In the standard operating mode, the enable signals are both switched at the same time and CLK_STD is used to generate both MXD and MXQ signals. The MXQ circuit 505 is enabled by the MXQ_EN signal being at a logic high. The MXD circuit 506 is enabled by the MXD_EN signal being at a logic high.

In the fast data access mode, MXQ_EN is switched on first and used with the CLK_FDA signal to generate the MXQ signals. The MXD signals are generated from CLK_STD with MXD_EN.

The output control signals from the MXD toggle flip flop 506, during the standard operating mode (with a CAS latency of 3), are illustrated in the MXD<1:0> lines of the timing diagram of FIG. 6. The output control signals from the MXQ toggle flip flop 505, during the standard operating mode (with a CAS latency of 3), are illustrated in the MXQ<1:0> lines of the timing diagram of FIG. 6. The same lines of FIG. 7 illustrate the respective outputs of these circuits 505 and 506 during the fast data access mode.

Figure 8:
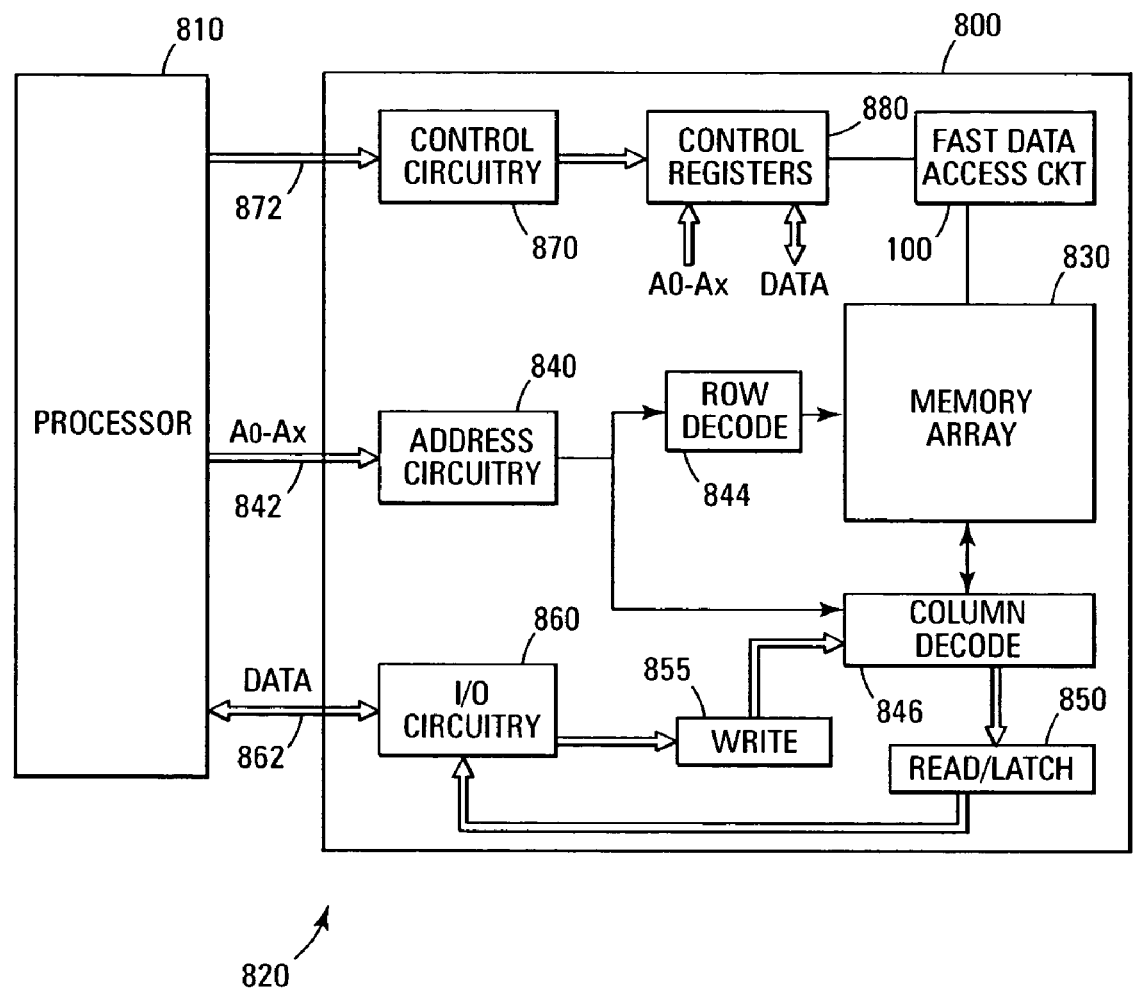
FIG. 8 shows a block diagram of an electronic system in accordance with one embodiment of the present invention.

FIG. 8 illustrates a functional block diagram of a memory device 800 of one embodiment of the present invention that is coupled to a controller circuit 810. The controller circuit 810 may be a microprocessor, a processor, or some other type of controlling circuitry. The memory device 800 and the controller 810 form part of an electronic system 820. The memory device 800 has been simplified to focus on features of the memory that are helpful in understanding the present invention.

The memory device includes an array of memory cells 830. The memory cells are non-volatile floating-gate memory cells and the memory array 830 is arranged in banks of rows and columns.

An address buffer circuit 840 is provided to latch address signals provided on address input connections A0–Ax 842. Address signals are received and decoded by a row decoder 844 and a column decoder 846 to access the memory array 830. It will be appreciated by those skilled in the art, with the benefit of the present description, that the number of address input connections depends on the density and architecture of the memory array 830. That is, the number of addresses increases with both increased memory cell counts and increased bank and block counts.

The memory device 800 reads data in the memory array 830 by sensing voltage or current changes in the memory array columns using sense/latch circuitry 850. The sense/latch circuitry, in one embodiment, is coupled to read and latch a row of data from the memory array 830. Data input and output buffer circuitry 860 is included for bi-directional data communication over a plurality of data connections 862 with the controller 810). Write circuitry 855 is provided to write data to the memory array.

Control circuitry 870 decodes signals provided on control connections 872 from the processor 810. These signals are used to control the operations on the memory array 830, including data read, data write, and erase operations. In one embodiment, the control circuitry 870 executes the methods of the present invention.

The fast data access circuit 100 of the present invention may be implemented in the electronic system as illustrated in FIG. 8. Portions of the control registers 880, memory array 830, and column decoder 846 are also illustrated in FIG. 1 as being part of the circuit 100. These circuit elements are not required to be part of the fast data access circuit 100.

The flash memory device illustrated in FIG. 8 has been simplified to facilitate a basic understanding of the features of the memory. A more detailed understanding of internal circuitry and functions of flash memories are known to those skilled in the art.

The previous discussion of the present invention refers to synchronous flash memory as being a memory device that can incorporate the fast data access circuit of the present invention. However, the present invention is not limited to any one type of memory. Nor is the present invention limited to any one type of flash memory. For example, the present invention can be incorporated into NAND-type flash device, a NOR-type flash device, or any other type of memory device that would benefit from increasing the throughput of data through a data pipeline architecture.

CONCLUSION

In summary, the circuit of the present invention provides fast data access at higher clock frequencies through the use of additional mode/configuration register settings. These settings are used to set the clock frequency and to switch the memory device from its standard operating mode to a fast data access mode. In this mode, a delayed clock is generated and used to clock data out of the final stage of the pipelined architecture.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A fast data access circuit having an input clock signal and an input data burst signal comprising a plurality of data bits, the input clock signal having a frequency, the circuit comprising:
    a mode/configuration register for generating a mode control signal in response to a loaded configuration word comprising at least one mode control bit and at least one clock frequency selection bit that is set in response to the input clock signal frequency;
    a clock delay circuit coupled to the input clock signal and the mode/configuration register, the clock delay circuit providing, in response to the at least one clock frequency selection bit, a selectable time delay to the input clock signal to produce a delayed clock signal such that the time delay is smaller for higher input clock signal frequencies;
    a multiplexing circuit having a first input coupled to the input clock signal and a second input coupled to the delayed clock signal, the multiplexing circuit outputting a selected clock signal in response to the mode control signal;
    control logic for generating a plurality of register control signals in response to the selected clock signal; and
    a data first-in-first-out register, coupled to the control logic and the input data burst signal, for outputting each of the plurality of data bits at a rate selectable by the plurality of register control signals.

2. The circuit of claim 1 wherein the clock delay circuit comprises a plurality of delay circuits each coupled to a selection circuit, each selection circuit being coupled to the at least one clock frequency selection bit.

3. The circuit of claim 2 wherein each of the plurality of delay circuits comprises a plurality of inverter gates.

4. A memory device comprising:
    an array of memory cells for storing a plurality of data bits;
    a clock input for accepting a clock signal; and
    a fast data access circuit comprising:
        a clock delay circuit that generates a delayed clock signal, from a plurality of selectable time delays, in response to the clock signal and a delay control signal;
        a control circuit that generates a mode control signal and the delay control signal;
        a multiplexing circuit having a first input coupled to the clock signal and a second input coupled to the delayed clock signal, the multiplexing circuit outputting a selected clock signal in response to the mode control signal;
        control logic for generating data output register control signals in response to the selected clock signal; and
        a first-in-first-out data output register, coupled to the data output register control signals and the array of memory cells, for outputting the plurality of data bits at a data rate determined by the selected clock signal.

5. The memory device of claim 4 and further including a burst counter for generating a plurality of sequential addresses, within a predetermined address range, to the array of memory cells such that a plurality of data is accessed within the predetermined address range.

6. An electronic system comprising:
    a processor that generates control signals; and
    a memory device for storing and accessing data in response to the control signals, the device comprising:
        an array of memory cells for storing a plurality of data bits;
        a clock input for accepting a clock signal; and
        a fast data access circuit coupled to the array of memory cells, the circuit comprising:
            a clock delay circuit that generates a delayed clock signal, from a plurality of selectable time delays, in response to the clock signal and a delay control signal;
            a control circuit that generates a mode control signal;
            a multiplexing circuit having a first input coupled to the clock signal and a second input coupled to the delayed clock signal, the multiplexing circuit outputting a selected clock signal in response to the mode control signal; and a data output register, coupled to the multiplexing circuit and the array of memory cells, for outputting the plurality of data bit at a data rate determined by the selected clock signal.

7. A method for performing fast data access in a memory device comprising an array of memory cells, the method comprising:
    generating a delayed clock signal from an input clock signal such that the delay is selected from a plurality of delays in response to a control input;
    selecting between the input clock signal and the delayed clock signal to generate a selected clock signal;
    generating a plurality of data output register control signals in response to the selected clock signal;
    transferring a plurality of data bits from the array of memory cells to a first-in-first-out data output register; and
    outputting the plurality of data bits from the data output register at a rate determined by the plurality of data output register control signals.

8. The method of claim 7 wherein the control input is a configuration word loaded into a mode/configuration register.

9. The method of claim 7 and further comprising receiving a configuration word comprising at least one bit indicating a fast data access mode and at least one bit indicating a frequency of the input clock signal.

10. A method for performing fast data access in an electronic system including a memory device comprising an array of memory cells, the method comprising:
    generating a configuration word incorporating at least one mode select bit and at least one clock frequency indication bit;
    loading the configuration word into a mode/configuration register;
    generating a delayed clock signal from an input clock signal such that the delay is selected from a plurality of delays in response to the at least one clock frequency indication bit;
    selecting between the input clock signal and the delayed clock signal, in response to the at least one mode select bit, to generate a selected clock signal;
    generating a plurality of data FIFO register control signals in response to the selected clock signal;
    storing a plurality of data bits from the array of memory cells to a data FIFO register; and
    outputting the plurality of data bits from the data FIFO register at a rate determined by the plurality of data FIFO register control signals.

* * * * *